(12) United States Patent
Tuominen et al.

(10) Patent No.: US 11,160,165 B2
(45) Date of Patent: Oct. 26, 2021

(54) COMPONENT CARRIER WITH THROUGH HOLE EXTENDING THROUGH MULTIPLE DIELECTRIC LAYERS

(71) Applicant: AT&S Austria Technologie & Systemtechnik Aktiengesellschaft, Leoben (AT)

(72) Inventors: Mikael Tuominen, Pernio (FI); Seok Kim Tay, Singapore (SG); Sally Sun, Shanghai (CN); Robin Zhang, NanJing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/028,618

(22) Filed: Sep. 22, 2020

(65) Prior Publication Data
US 2021/0100095 A1    Apr. 1, 2021

(30) Foreign Application Priority Data

Sep. 27, 2019  (CN) .................. 201910922919.9

(51) Int. Cl.
| H05K 1/03 | (2006.01) |
| H05K 1/11 | (2006.01) |
| H05K 3/00 | (2006.01) |
| H05K 3/40 | (2006.01) |

(52) U.S. Cl.
CPC ............. *H05K 1/036* (2013.01); *H05K 1/115* (2013.01); *H05K 3/0047* (2013.01); *H05K 3/4038* (2013.01); *H05K 2201/09563* (2013.01)

(58) Field of Classification Search
CPC ...... H05K 1/036; H05K 1/115; H05K 3/0047; H05K 3/4038; H05K 2201/09563; H05K 3/0038; H05K 1/185; H05K 2203/107
USPC ........................................................ 174/255
See application file for complete search history.

(56) References Cited

U.S. PATENT DOCUMENTS

| 8,456,016 B2 | 6/2013 | Li et al. |
| 9,674,937 B2 | 6/2017 | Park |
| 9,693,445 B2 | 6/2017 | Ku et al. |
| 9,736,927 B2 | 8/2017 | Cho et al. |
| 2010/0289154 A1 | 11/2010 | Li et al. |

(Continued)

OTHER PUBLICATIONS

Batev, P.; Extended European Search Report in Application No. 20 196 984.7; pp. 1-8; Feb. 8, 2021; European Patent Office, 80298, Munich Germany.

(Continued)

*Primary Examiner* — Sherman Ng
(74) *Attorney, Agent, or Firm* — Robert A. Blaha; Smith Tempel Blaha LLC

(57) ABSTRACT

A component carrier and a method of manufacturing a component carrier are provided. The component carrier includes a stack having a front side and a back side, the stack including a plurality of stacked electrically insulating layer structures, a through hole being narrower in its inner portion compared to its exterior portions and extending through the plurality of electrically insulating layer structures so that sidewalls of each of the electrically insulating layer structures delimit respective parts of the through hole, and an electrically conductive filling medium filling at least a part of the through hole.

14 Claims, 2 Drawing Sheets

(56) References Cited

U.S. PATENT DOCUMENTS

| | | | |
|---|---|---|---|
| 2011/0048783 A1* | 3/2011 | Yu | H05K 3/465 |
| | | | 174/261 |
| 2011/0232948 A1* | 9/2011 | Sato | H05K 3/4661 |
| | | | 174/255 |
| 2012/0043128 A1* | 2/2012 | Yoon | H05K 3/429 |
| | | | 174/266 |
| 2012/0168220 A1 | 7/2012 | Lee et al. | |
| 2012/0246924 A1 | 10/2012 | Hibino et al. | |
| 2012/0246925 A1 | 10/2012 | Hibino et al. | |
| 2014/0027163 A1 | 1/2014 | Min et al. | |
| 2014/0124255 A1 | 5/2014 | Kim | |
| 2014/0144686 A1 | 5/2014 | Shimizu | |
| 2014/0154463 A1* | 6/2014 | Liang | H05K 3/0032 |
| | | | 428/131 |
| 2015/0313018 A1* | 10/2015 | Maeda | H05K 1/0366 |
| | | | 174/255 |
| 2016/0135289 A1 | 5/2016 | Cho et al. | |
| 2016/0143149 A1* | 5/2016 | Su | H05K 1/188 |
| | | | 174/251 |
| 2016/0192490 A1* | 6/2016 | Kang | H05K 1/0346 |
| | | | 174/258 |
| 2016/0227641 A1 | 8/2016 | Ku et al. | |
| 2016/0381781 A1 | 12/2016 | Park | |

OTHER PUBLICATIONS

Anonymous, 92ML Laminates and Prepregs Rogers Corporation (Data Sheet); Publication # 92-185; 2019; pp. 1-4; Advanced Connectivity Solutions, Chandler, AZ, USA.

Anonymous, Ajinomoto Build-up Film—A microfilm insulation for electronic devices; as available on the Internet at https://www.ajinomoto.com/innovation/action/buildupfilm; captured on Sep. 22, 2020.

* cited by examiner

COMPONENT CARRIER WITH THROUGH HOLE EXTENDING THROUGH MULTIPLE DIELECTRIC LAYERS

TECHNICAL FIELD

The invention relates to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of vias, which may be copper filled, may be advantageous for this and other purposes.

SUMMARY

There may be a need to manufacture a component carrier with proper electric reliability.

According to an exemplary embodiment of the invention, a component carrier is provided which comprises a stack having a front side and a back side and comprising a plurality of stacked electrically insulating layer structures (wherein different ones of the electrically insulating layer structures may be made of the same material or may be made of different materials), a through hole (in particular a through hole made by laser processing, or alternatively by any other appropriate method such as a plasma process) being narrower (in particular being narrowest) in its inner portion compared to its exterior portions and extending through the plurality of electrically insulating layer structures (in particular extending entirely through all of the plurality of electrically insulating layer structures). This may be accomplished in such a manner that sidewalls of each of the electrically insulating layer structures delimit respective parts of the through hole (in particular in such a manner that each of the electrically insulating layer structures contributes directly to the formation and definition of the through hole), and an electrically conductive filling medium (which may be composed of one or multiple plated substructures, for instance made of copper) filling at least a part of the through hole.

According to another exemplary embodiment of the invention, a method of manufacturing a component carrier is provided, wherein the method comprises providing a stack having a front side and a back side and comprising a plurality of stacked electrically insulating layer structures, carrying out a first laser drilling into the electrically insulating layer structures (in particular into a first part of the electrically insulating layer structures) from the front side to thereby form a blind hole in the stacked electrically insulating layer structures, thereafter carrying out a second laser drilling into the electrically insulating layer structures (in particular into a second part of the electrically insulating layer structures) from the back side to thereby extend the blind hole into a laser through hole. The laser through hole may be formed to be narrower in its inner portion compared to its exterior portions. Furthermore, the laser through hole may extend through the plurality of electrically insulating layer structures so that sidewalls of each of the electrically insulating layer structures delimit respective parts (or portions or sections) of the laser through hole. The method may further comprise at least partially filling the laser through hole with an electrically conductive filling medium.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of one another.

In the context of the present application, the term "through hole" may particularly denote a hole extending completely through the entire layer structures, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the layer structures. One or more laser shots may be performed from each of these sides. Formation of a through hole by laser processing from only one main surface may be possible as well. Furthermore, formation of a through hole may be carried out as well by other methods than laser processing, for instance by a plasma treatment.

According to an exemplary embodiment of the invention, a through hole (preferably a laser through hole) filled partially or entirely with an electrically conductive filling medium may be manufactured which extends through a plurality of different electrically insulating layer structures. It has turned out surprisingly that stacking different electrically insulating layer structures even made of different materials and/or of different thicknesses does not prevent formation of a common through hole extending through all of said electrically insulating layer structures, in particular by drilling with a corresponding laser beam firstly from a front side and subsequently from a back side of said multi dielectric layer stack. Thus, through hole formation has turned out possible even in a stack of electrically insulating layer structures of heterogeneous properties. This is highly advantageous, since forming a single through hole traversing multiple dielectric layers and filling the through hole with electrically conductive filling medium significantly increases the freedom of design of a circuit designer of configuring or adjusting the properties of the component carrier. For instance, the various dielectric layers may be individually functionalized for adjusting desired properties of the component carrier and the through hole. This may involve, for instance, functionalizing the dielectric layers by enhancing heat removal during hole drilling (preferably laser drilling), reducing carbonization, improving the impact of a laser beam or the like on the stack, etc. Highly advantageously, the produced through hole may be narrower in its inner portion compared to its exterior portions, i.e. may deviate from an entirely cylindrical shape. With such a locally narrowed bottleneck in an inner portion of the through hole, it may be ensured that a procedure of filling the through hole with electrically conductive filling medium properly creates a bridge structure around the narrowed (or even narrowest) portion of the through hole in the interior of the stack. It has turned out that this geometry properly prevents undesired void formation within the electrically conductive filling medium. Such voids may deteriorate the electric and/or thermal performance of such an electrically conductive filling medium. Moreover, it is advantageous that interior sidewalls of each of the opened (in particular laser drilled) electrically insulating layer structures may contribute to directly delimit or define a respective part of the through hole in the stack. Thus, it may be in particular possible to directly laser drill through the stacked electrically insulating layer structures without the need of forming a dielectric inlay or the like in the stack through which a laser (or any other through hole forming entity) extends during through hole formation (in particular laser drilling) for forming the through hole. Directly drilling (preferably with a laser beam) through the stacked electrically insulating layer structures for forming interior sidewalls of the electrically insulating layer structures which then altogether delimit respective vertical portions of the through hole may significantly simplify the manufacturing process and may reduce the complexity.

In the following, further exemplary embodiments of the component carrier and the method will be explained.

In an embodiment, the stack comprises a core, in particular comprising fully cured dielectric material. Such a core may for instance be made of FR4 material. A core may be a thick dielectric layer of fully cured material which no longer solidifies upon temperature increase or exerted mechanical pressure.

In an embodiment, the core is free of copper foils. Thus, a purely dielectric core may be the basis for the formation of the through hole.

In an embodiment, dielectric material of any of the electrically insulating layer structures of the stack comprises one or more of the following:
resin (in particular epoxy resin) and reinforcing particles (in particular glass fibers), in particular prepreg;
epoxy derivatives (in particular Ajinomoto Build-up Film®;
glass;
ceramic. Ajinomoto Build-up Film® is a registered mark of Ajinomoto Co. Inc. of Tokyo, Japan.

As can be taken from this list, very different dielectric materials may be combined in the multiple dielectric layer stack through which a common through hole is formed. Thus, the high freedom of selecting materials of the stack allows also a proper adjustment of the properties of the component carrier without compromising on the freedom of forming plated through holes even through multiple dielectric layers as a whole.

In an embodiment, the stack additionally comprises adhesion promoting layer. Such an adhesion promoting layer may be configured for promoting adhesion between two electrically insulating and/or electrically conductive layers of the stack connected by the adhesion promoting layer. Such an adhesion promoting layer may also be electrically insulating and may be one of the multiple electrically insulating layer structures through which a common through hole is formed. Said adhesion promoting layer may have a thickness in a range between 0.2 µm and 2 µm.

In an embodiment, the stack comprises a core comprising FR4 covered on both opposing main surfaces thereof with a layer of Ajinomoto Build-up Film® or ABF layer. An FR4 core may provide stability. In particular, an ABF layer connected to such a core may be highly advantageous as one of the multiple electrically insulating layer structures through which a common through hole is formed. ABF may have excellent electrically insulating and thermally conductive properties and may be properly compatible with high frequency applications. Furthermore, such an ABF material may be free of glass fibers which may simplify formation of a through hole extending through such an ABF layer.

In an embodiment, an overall thickness of the electrically insulating layer structures of the stack when taken together is in a range between 30 µm and 250 µm, in particular in a range between 70 µm and 200 µm. Thus, even with relatively thick multi dielectric layers, formation of a single common through hole is possible.

In an embodiment, each individual one of the electrically insulating layer structures of the stack has a thickness of at least 10 µm, in particular at least 20 µm. Thus, the different electrically insulating layer structures may be relatively thin, however may be preferably thicker than 10 µm or even 20 µm.

In an embodiment, the stack consists of the electrically insulating layer structures at least in a first region which extends from the front side up to the back side around the through hole. In other words, the entire through hole may be formed in an entirely dielectric portion of the stack which is composed exclusively by said electrically insulating layer structures through which the through hole extends.

Still referring to the previously described embodiment, the electrically insulating layer structures may be separated by at least one electrically conductive layer structure in a second region (being different from the first region). Thus, one or more second regions of the stack may be provided with electrically conductive layer structures as well, to refine the electric connection function of the component carrier, to improve the thermal performance and/or to improve mechanical stability.

In an embodiment, the component carrier comprises a component embedded in the stack. In view of the possibility of combining different dielectric materials in the stack through which a common through hole is formed, it is also possible to adjust the properties of the component carrier so as to simultaneously enable embedding of a component. Embedding of a component may be influenced by laser via formation. However, the component can for instance be surrounded by an elastic material of one or more of the electrically insulating layer structures making it easier for the component to survive the stress exerted during the formation of the through hole.

In an embodiment, a material of at least one of the electrically insulating layer structures is functionalized. For example, the material of the at least one of the electrically insulating layer structures is functionalized as at least one of the group consisting of a mechanical buffer (which may have a low value of the Young modulus, for instance less than 10 GPa), a heat removal structure (which may have a high thermal conductivity, for instance more than 2 W/mK), and a low loss high-frequency dielectric (which may have a low DK value). Thus, different functionalized dielectric materials may be combined for defining the stack through which a common through hole is formed. This increases the functionality of the obtained component carrier.

In an embodiment, interfaces between connected electrically insulating layer structures of the stack are free of electrically conductive material. For instance, the stack may be provided with at least two of the plurality of stacked electrically insulating layer structures being at least partially directly connected with each other. In particular, the dielectric material of different electrically insulating layer structures of different material may be directly connected with each other without metallic material in between.

In an embodiment, the first laser drilling may form a blind hole extending from the front side through at least part of at least two of the electrically insulating layer structures (for instance an upper one and a central one). The second laser drilling may then extend through at least part of at least two of the electrically insulating layer structures (for instance a lower one and the central one) to thereby complete the through hole by connecting to the blind hole from the back side. Thus, each of the first laser drilling and the second laser drilling may extend through more than only one electrically insulating layer structure.

In an embodiment, the method comprises carrying out the first laser drilling extending through an entire first electrically insulating layer structure and into a part of a second electrically insulating layer structure, and carrying out the second laser drilling extending through an entire third electrically insulating layer structure and into another part of the second electrically insulating layer structure so as to complete the through hole. Thus, laser drilling through three (or even more) different electrically insulating layer structures may be possible. In the first drilling process from the front side, the laser shot may extend through the entire first electrically insulating layer and into part of the second electrically insulating layer structure. With the second laser shot from the back side, the laser through hole may extend through the entire third electrically insulating layer structure and the remaining portion of the second electrically insulating layer structure. By taking this measure, it is for instance possible to form a laser through hole through a central prepreg or FR4 layer covered on both opposing main surfaces thereof with an ABF layer.

In an embodiment, the method comprises covering the electrically insulating layer structures with a first electrically conductive layer structure at the front side, and forming a first window extending through the first electrically conductive layer structure, in particular by laser drilling or by a conformal mask. In the context of the present application, the term "window" may particularly denote a through hole, in particular a circular through hole, extending through an electrically conductive layer structure as a result of a treatment of this electrically conductive layer structure. Descriptively speaking, the energy of the laser beam may remove material of the electrically conductive layer structure in the region of the window. Formation of the first window may be accomplished by the same laser beam which also creates the blind hole in the first drilling procedure. Alternatively, the window may be formed by etching a through-hole through the electrically conductive layer structure. Using the laser for forming the window has the advantage that no additional procedure is necessary for window formation. Using an etched window has the advantage that this may reduce or even eliminate an overhang of the electrically conductive layer structure beyond the electrically insulating layer structures.

In an embodiment, the method comprises covering the electrically insulating layer structures with a second electrically conductive layer structure at the back side, and forming a second window extending through the second electrically conductive layer structure, in particular by laser drilling or by a conformal mask. Thus, the second window on the back side may be formed in a corresponding way as the first window on the front side, i.e. as described above.

As already mentioned, the component carrier may comprise electrically conductive filling medium filling at least part of the through hole. Preferably, the electrically conductive filling medium may comprise or consist of copper. In one embodiment, the entire through hole is filled with copper. In another embodiment, only a portion of the through hole is filled with copper. Filling the through hole with electrically conductive material may be accomplished by firstly forming a thin seed layer of electrically conductive material on the sidewalls of the electrically insulating layer structures delimiting the through hole. Such a seed layer may for instance be formed by electroless deposition or sputtering in order to prepare the through hole for a subsequent plating procedure. Subsequently, one or more plating procedures may be carried out for firstly thickening sidewall coverage with electrically conductive material, followed by the formation of a bridge connecting the opposing sidewalls in a substantially horizontal direction. This may be followed, in turn, by a filling of remaining recesses above and below the bridge structure with further electrically conductive filling medium such as copper.

In particular, the electrically conductive filling material may comprise a bridge structure connecting opposing sidewalls of the electrically insulating layer structure delimiting the through hole. In the context of the present application, the term "bridge structure" may particularly denote an electrically conductive structure extending substantially horizontally between opposing sidewalls of the electrically insulating layer structure delimiting the through hole, in particular at or close to a narrowest portion of the through hole. For instance, such a bridge structure can be formed by plating following through hole formation. After such a plating procedure, the previously formed through hole is only partially filled with electrically conductive material constituting the bridge structure, so that the bridge structure may be delimited in an upward direction by a first demarcation surface and at a lower side by a second demarcation surface. Both the first demarcation surface and the second demarcation surface may have a concave shape. Proper formation of such a bridge structure without undesired voids in an interior thereof may be promoted by the shaping of the through hole with a narrower section in the inner portion as compared to exterior portions thereof.

In an embodiment, the component carrier is configured as an interposer. Due to the relatively thin stack which nevertheless has multiple (and in particular different) electrically insulating layer structures, a component carrier with stable shape can be obtained which is optimally suited to be configured as interposer. For instance, a plurality of through holes of the above-mentioned type, extending in parallel to each other and each extending through multiple electrically insulating layer structures and being at least partially filled with electrically conductive filling medium, may be formed in the stack to obtain an interposer with multiple vertical electrically conductive paths.

In an embodiment, the first laser drilling comprises one laser shot, and the second laser drilling comprises only one laser shot. This may be an advantageous approach for thinner electrically insulating layer structures and may result in an X-shape of the laser through hole. Hence, at least a part of the laser through hole is substantially X-shaped in a cross-sectional view. A substantially X-shaped laser through hole may be obtained by carrying out a single laser shot during front side drilling and a single laser shot during back side drilling.

In another embodiment, the first laser drilling comprises one laser shot, and the second laser drilling comprises two laser shots. This may be preferred for thicker electrically insulating layer structures and may result in two exterior tapering portions connected by a straight inner portion of the laser through hole. The straight portion may have different vertical lengths on different sidewalls. In such an embodiment, at least a part of the laser through hole may have a central substantially cylindrical section between two opposing tapering sections. By such an alternative approach, the narrowest section of the laser through hole may be rendered broader or wider by an additional third laser shot from the back side. In other words, a laser through hole with the described geometry may be obtained by firstly carrying out one laser shot for front side drilling followed by two laser shots during back side drilling. This approach may be capable of further improving electrical reliability.

In an embodiment, the component carrier comprises a stack of the electrically insulating layer structures and at least one electrically conductive layer structure. For example, the component carrier may be a laminate of the mentioned electrically insulating layer structures and electrically conductive layer structure(s), in particular formed by applying mechanical pressure and/or thermal energy. The mentioned stack may provide a plate-shaped component carrier capable of providing a large mounting surface for components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded or surface mounted electronic component, can be conveniently assembled, thanks to its small thickness, into or onto a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through holes through the laminate, for instance by laser drilling and/or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be, in relation to a PCB, a comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the electrically insulating layer structures comprise at least one of the group consisting of resin (such as reinforced or non-reinforced resins, for instance epoxy resin or Bismaleimide-Triazine resin), cyanate ester, polyphenylene derivate, glass (in particular glass fibers, multilayer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with a supra-conductive material such as graphene.

At least one component can be surface mounted and/or embedded and can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof.

In an embodiment, the component carrier is a laminate-type component carrier. In such an embodiment, the component carrier is a compound of multiple layer structures which are stacked and connected together by applying a pressing force and/or heat.

The substrate or interposer may consist of at least a layer of glass, Silicon (Si) or a photoimageable or dry-etchable organic material like epoxy-based build-up films or polymer compounds like Polyimide, Polybenzoxazole, or Benzocyclobutene.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layer structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), ENIG (Electroless Nickel Immersion Gold), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
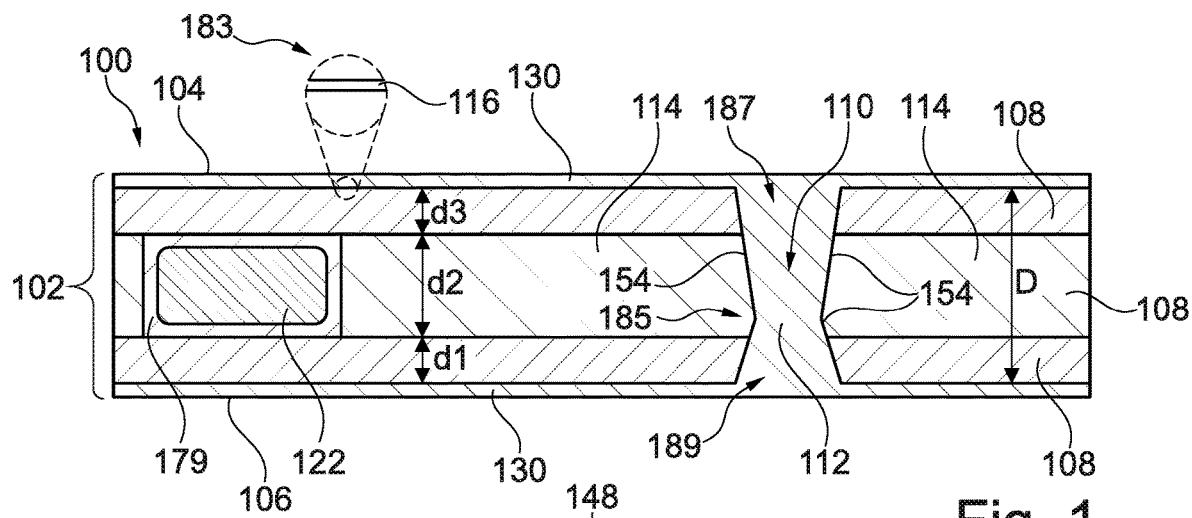
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a through hole may be provided which is drilled through multiple dielectric layers, in particular through a multilayer core. Each of the electrically insulating layer structures may be made of a homogeneous dielectric material, which can be the same as or a different one than that of another one of the electrically insulating layer structures. Thus, in contrast to conventional approaches, through hole drilling (in particular laser through hole drilling) may extend over more than one core dielectric layer. This may contribute to package thickness reduction and material flexibility (for instance, it may be possible to mix different materials in a core stack up). Thus, through hole drilling may be carried out over multiple core layers which may each form part of a sidewall of the common through hole.

In particular, this may provide a core package where a low CTE (coefficient of thermal expansion) core is combined with other dielectric materials, such as ABF materials.

Functionalization of the individual electrically insulating layer structures is possible. In particular when the electrically insulating layer structures comprise a low Young modulus material (such as ABF), it is possible to form a laser through hole through multiple electrically insulating layer structures and embed a component in the stack. Descriptively speaking, such a low Young modulus material may function as a mechanical buffer for preventing the component from stress during the laser processing. Also, for producing ultra-flat component carriers, the implementation of one or more ABF layers is advantageous, since it suppresses warpage. The formation of laser through holes is thereby not compromised at all. It is also possible that one of the multiple electrically insulating layer structures through which a common laser through hole is formed is specifically configured for heat removal, i.e., is made of a material with a high thermal conductivity. Functionalized materials with high heat dissipation may be implemented as well. Such a material with high heat dissipation due to high thermal conductivity may for example have a thermal conductivity of more than 0.8 W/mK, in particular more than 5 W/mK. For instance, a material with high thermal conductivity which can be implemented according to an exemplary embodiment of the invention is a Rogers material, in particular is a dielectric material of the Rogers 92ML series.

Laser through hole drilling may then extend evenly over a whole package. This may enable the provision of a component carrier with a thinner core package. When the diameter of the narrowest portion of the laser through hole is properly selected, the provision of a narrower portion in an interior of the laser through hole may simplify filling of the laser through hole with an electrically conductive filling medium which may in particular comprise a horizontal bridge structure connecting opposing sidewalls in the narrowed portion without the risk of void and crack formation in the electrically conductive filling medium.

Advantageously, such a laser through hole drilling through multiple electrically insulating layer structures may be advantageously combined with embedding a component in such a stack. Another advantage is to include a combination of mixed material systems in one core package and to combine the core material with for example primer resin layers. Concepts according to exemplary embodiments of the invention may provide a further core thickness reduction, in particular in packaging. In exemplary embodiments, a core may use a primer resin or several (different or identical) prepreg layers.

Advantageously, a common laser through hole may be formed extending through multiple directly or indirectly stacked electrically insulating layer structures. For instance, an FR4 core may be covered on both opposing main surfaces thereof with a respective ABF layer. A laser through hole may be formed with a front side drilling and a back-side drilling extending through all these three electrically insulating layers. At the time of laser drilling, the stack of multiple electrically insulating layer structures may or may not be covered with a copper foil on one or both opposing main surfaces.

When electrically conductive layer structures such as copper foils are present on the stack comprising multiple electrically insulating layer structures, it is possible that a window is firstly formed in the electrically conductive layer structure(s) before forming the laser through hole extending through the multiple dielectric layer structures. Such windows may be formed by the laser drilling process itself, or may be formed by patterning the electrically conductive layer structures, for example by etching.

Although through holes of component carriers according to exemplary embodiments of the invention may be also created by other processes than laser drilling (for instance by a plasma process), the exemplary embodiment described in the following referring to the drawings show laser through holes.

FIG. 1 illustrates a cross-sectional view of a component carrier 100 according to an exemplary embodiment of the invention.

The illustrated component carrier 100 comprises a laminated stack 102 having a front side 104 and a back side 106. The stack 102 comprises a plurality of (in the illustrated embodiment three) stacked electrically insulating layer structures 108, which may be made of the same or different dielectric materials. Each of the planar layer shaped electrically insulating layer structures 108 may be made of a homogeneous dielectric material. As shown as well, a single laser through hole 110 extends through the plurality of electrically insulating layer structures 108 in common. As shown in FIG. 1, the through hole 110 is substantially X-shaped.

As shown, the laser through hole 110 is narrower in its inner portion 185 (for instance a central portion, i.e. centrally in a vertical direction) compared to its exterior portions 187, 189 (i.e. the portions of the laser through hole 110 at the front side 104 and at the back side 106). Such a shape of the laser through hole 110 may be achieved for example by the manufacturing methods described below referring to FIG. 2 and FIG. 3. An electrically conductive filling medium 112, such as copper, fills the laser through hole 110. In particular referring to FIG. 5, it will also be described how the electrically conductive filling medium 112 can be filled into the laser through hole 110 without excessive voids (which may deteriorate electric and/or thermal conductivity and may promote undesired crack formation). Descriptively speaking, filling the laser through hole 110 with the electrically conductive filling medium 112 in particular involves formation of a bridge structure (compare reference sign 181 in FIG. 5). Providing the laser through hole 110 with a narrowest portion centrally in the stack 102 significantly simplifies proper formation of bridge structure 181 and therefore promotes a substantially void free filling of the laser through hole 110 with electrically conductive filling medium 112.

Electrically conductive layer structures 130 (for instance copper foils) may be connected (for instance laminated or plated) on the top side and the bottom side of component carrier 100.

As can be taken from FIG. 1 as well, the laser through hole 110 extends through the plurality of electrically insulating layer structures 108 so that sidewalls 154 of each of the electrically insulating layer structures 108 delimits respective parts of the laser through hole 110. Descriptively speaking, different dielectric materials of the different electrically insulating layer structures 108 (each of which being made of a homogeneous dielectric material) may delimit different portions of the sidewalls 154 of laser through hole 110. In other words, the laser through holes 110 may be formed directly in the planar electrically insulating layer structures 108 by directly removing dielectric material of the electrically insulating layer structures 108 due to the impact with the laser (compare FIG. 2 and FIG. 3). Highly advantageously, the cumbersome formation of a dielectric inlay in the electrically insulating layer structures 108 before initiating laser drilling may be dispensable. This may significantly simplify component carrier manufacture with laser through hole formation extending through multiple electrically insulating layer structures 108.

In the illustrated embodiment, the stack 102 comprises a core 114 made of a fully cured dielectric material such as FR4. The material of the core 114 comprises fully cured (i.e. cross-linked) epoxy resin with reinforcing particles, such as glass fibers, therein. As shown, the core 114 is free of copper foils and consists exclusively of dielectric material. The dielectric material of the central electrically insulating layer structure 108 of the stack 102 may thus comprise cured prepreg, i.e. FR4.

In contrast to this, the two exterior electrically conductive layer structures 108 may be made of an epoxy derivative, such as Ajinomoto Build-up Film®. Yet other materials of electrically insulating layer structures 108 may be glass or ceramic. Between adjacent ones of the electrically insulating layer structures 108, the stack 102 may comprise one or more adhesion promoting layers 116 (as shown in detail 183).

As shown, the stack 102 thus comprises core 114, for instance made of FR4, as central electrically insulating layer structure 108 covered on both opposing main surfaces thereof with a respective other electrically insulating layer structure 108, which is for instance made of Ajinomoto Build-up Film®.

For instance, an overall thickness D of the electrically insulating layer structures 108 of the stack 102 when taken together may be preferably in a range between 70 µm and 200 µm. Each individual one of the electrically insulating layer structures 108 of the stack 102 has, in turn, a thickness d1, d2, d3. For instance, d2 may be in a range between 50 µm and 100 µm. In contrast to this, d1 and d3 (in particular d1=d3) may be in a range between 10 µm and 50 µm, but may be smaller than d2.

As shown, a component 122 is embedded in the stack 102. For instance, component 122 may be a semiconductor die. In the illustrated embodiment, component 122 is embedded in core 114. For instance, component 122 may be surrounded by a soft mechanical buffer structure 179, i.e., a dielectric material having a low value of the Young modulus (for instance below 10 GPa). This may reduce stress exerted to the component 122, for instance during laser drilling.

It is also possible that a material of at least one of the electrically insulating layer structures 108 is functionalized. Preferably, different electrically insulating layer structures 108 may be functionalized in a different way. For instance, the material of one electrically insulating layer structure 108 may be configured as a mechanical buffer. Another electrically insulating layer structure 108 may be functionalized to contribute to heat removal. Yet another electrically insulating layer structure 108 may be functionalized so as to achieve low loss at high frequency. It is also possible that a single electrically insulating layer structure 108 comprises more than one functionalization.

The component carrier shown in FIG. 1 has the advantage that the laser through hole 110 is formed through three directly connected electrically insulating layer structures 108. For example, the central and thickest electrically insulating layer structure 108 may be a core 114 made of FR4. The two thinner electrically insulating layer structures 108 attached to both opposing main surfaces of the thickest central electrically insulating layer structure 108 may for example be ABF layers. For instance, an RCC (resin coated copper) layer with filler size smaller than 5 µm may be used. The laser drilling process (which is described below in more detail referring to FIG. 2 to FIG. 4), as well as the process of filling the laser through hole 110 with electrically conductive filling medium 112 (which is described below in more detail referring to FIG. 5) are not compromised by the three electrically insulating layer structures 108 being made of different dielectric materials and thereby forming dielectric material interfaces in between. Highly advantageously, drilling through an ABF layer first and an FR4 layer thereafter (or vice versa) may be carried out to implement an ABF layer for stability and buffering. However, using materials with the same properties for the whole core may make the through hole creation more energy-consuming, time-consuming and/or wasteful.

Figure 2:
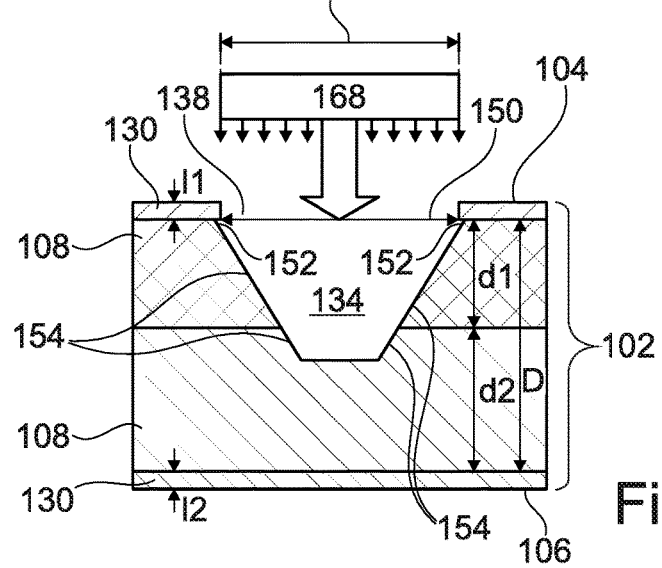
FIG. 2, FIG. 3, FIG. 4 and FIG. 5 illustrate cross-sectional views of structures obtained during carrying out methods of manufacturing a component carrier with a plated laser through hole, shown in FIG. 5, by a multiple laser shot treatment from opposing sides and by subsequent procedures of filling the laser through hole with electrically conductive material according to an exemplary embodiment of the invention.
Figure 3:
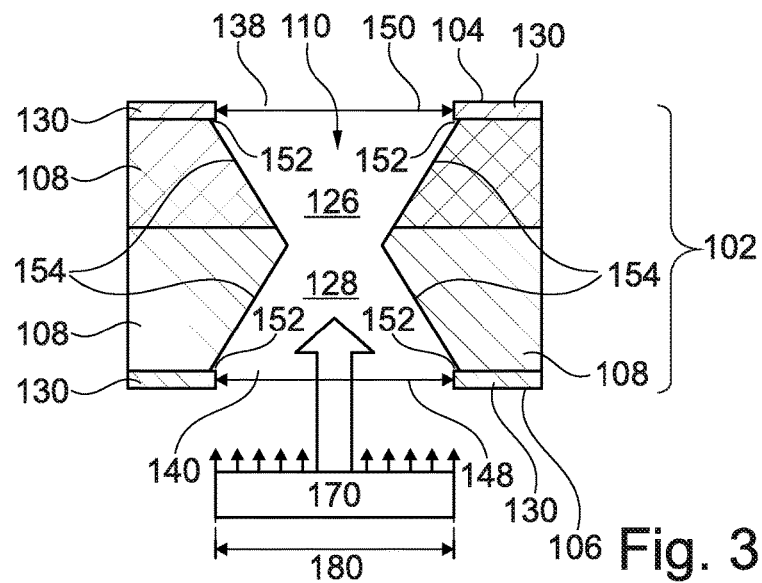
Figure 4:
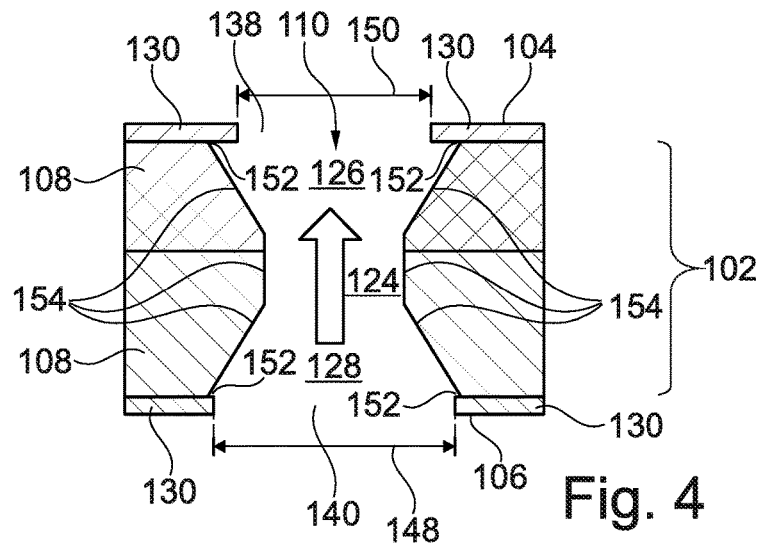
Figure 5:
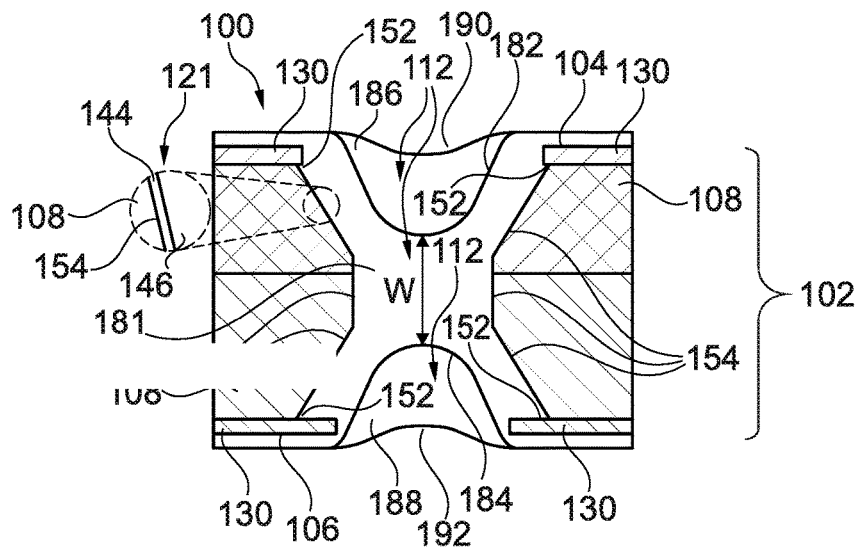

FIG. 2 to FIG. 4 illustrate cross-sectional views of structures obtained during carrying out methods of manufacturing a component carrier 100 with a laser through hole 112 extending through two stacked electrically insulating layer structures 108, shown in FIG. 3 and FIG. 4, by a multiple laser shot treatment from opposing sides according to an exemplary embodiment of the invention. FIG. 5 shows the correspondingly formed component carrier 100 after filling the laser through hole 112 with electrically conductive filling medium 126, preferably copper.

Referring to FIG. 2, a first laser shot corresponding to a first laser beam 168 is directed from front side 104 onto a double layer of electrically insulating layer structures 108 which is covered on both opposing main surfaces thereof with a respective electrically conductive layer structure 130. The dielectric materials of the individual electrically insulating layer structures 108 which are directly connected with each other at an interface may be different or identical.

Thus, a double layer of two electrically insulating layer structures 108 is provided which can comprise resin (such as epoxy resin) and optionally reinforcing particles such as glass fibers or glass spheres. The electrically insulating layer structures 108 may for instance be made of fully cured FR4 material, i.e. material having resin which is already completely cross-linked (or at least substantially fully cross-linked, for instance cross-linked to at least 95%) and is not capable of re-melting or becoming flowable by the application of mechanical pressure and/or heat. The electrically insulating layer structures 108 are covered by a first electrically conductive layer structure 130 on the front side 104. The first electrically conductive layer structure 130 may be a metal layer such as a copper foil. The electrically insulating layer structures 108 may be covered by a second electrically conductive layer structure 130 on the back side 106. The second electrically conductive layer structure 130 may be as well a metal layer such as a copper foil.

A vertical thickness D of the electrically insulating layer structures 108 together may be relatively small, for instance may be less than 100 µm (more specifically may be in a range between 40 µm and 60 µm). The individual electrically insulating layer structures 108 may have an even smaller individual thickness, d1 and d2. It has been found that laser through hole formation through such thin electrically insulating layer structures 108 is particularly difficult in terms of reliability issues which may be caused by phenomena such as an excessive overhang 152, which is described below in further detail. The first electrically conductive layer structure 130 on the front side and the second electrically conductive layer structure 130 on the backside may be metal layers each having a thickness, l1 and l2, of for instance less than 5 µm, in particular between 2 µm and 4 µm.

Stack 102 composed of the layer structures 108, 130 may be made subject of the first laser drilling through the first electrically conductive layer structure 130, through the entire upper electrically insulating layer structure 108 and into the lower electrically insulating layer structure 108 from the front side 104. More specifically, the first laser drilling extends through the entire upper electrically insulating layer structure 108 and into a part of the lower electrically insulating layer structure 108. As a result, a first window 138 is formed as a through hole in the first electrically conductive layer structure 130. Alternatively, first window 138 may also be formed by etching, in particular using a conformal mask. Furthermore, a blind hole 134 is formed in the electrically insulating layer structures 108 in a region adjacent the first window 138. The blind hole 134 is delimited by sidewalls 154 of the electrically insulating layer structures 108. This first laser drilling may be carried out using first laser beam 168 with a diameter or width 148 which is preferably in a range between 65 μm and 120 μm. As a result of the first laser drilling, a lateral overhang indicated schematically with reference numeral 152 can be created as beak-shaped pockets in the blind hole 134. The overhang 152 is located at an interface between the first window 138 formed in the patterned first electrically conductive layer structure 130 and an upper portion of the upper electrically insulating layer structure 108. Descriptively speaking, the patterned first electrically conductive layer structure 130 with its first window 138 may laterally extend beyond the electrically insulating layer structures 108 by an amount corresponding to the overhang 152.

As shown in FIG. 2, a through hole is formed as first window 138 with a lateral width 150 of for instance between 65 μm and 120 μm in the first electrically conductive layer structure 130 by first laser beam 168 having width 148 and being generated by a laser source. This first laser shot also forms the blind hole 134 in the electrically insulating layer structures 108. During laser processing from the front side 104, care should be taken that the laser power is selected sufficiently small and/or the first laser shot is made sufficiently short that the blind hole 134 does not extend up to the second electrically conductive layer structure 130. In such an event (that the blind hole extends up to the second electrically conductive layer structure), undesired phenomena such as reflection of the laser on the second electrically conductive layer structure 130 may occur which may deteriorate the electric performance of the manufactured component carrier 100.

Referring to FIG. 3, a second laser shot may be carried out with a laser source emitting a second laser beam 170 towards the bottom side of the stack 102 for opening the second electrically conductive layer structure 130 and for removing further dielectric material of the lower electrically insulating layer structure 108 from the bottom side. Thus, the second laser drilling extends into the electrically insulating layer structures 108 from the back side 106 to thereby extend the blind hole 134 into laser through hole 110, the latter extending through both electrically insulating layer structures 108. In other words, the second laser drilling extends into the lower part of the lower electrically insulating layer structure 108 so as to complete the through hole 110.

Although not shown in the figures, after the process described referring to FIG. 2, the stack 102 may be flipped (i.e. may be turned around by 180°) before carrying out the second laser drilling through the second electrically conductive layer structure 130 and through the electrically insulating layer structures 108 from the back side 106. By taking this measure, it may be prevented that the laser source has to be moved from the top side to the bottom side of the stack 102.

By the second laser shot, a second window 140 is formed extending through the second electrically conductive layer structure 130. Alternatively, second window 140 may be formed by etching, for instance using a conformal mask. Furthermore, additional material of the electrically insulating layer structures 108 may be removed by the second laser shot to extend the blind hole 134 into laser through hole 110 extending through the entire thickness of the electrically insulating layer structures 108. As shown, the second window 140 has a lateral width 148 which is smaller than the lateral width 150 of the first window 138. This results from the fact that the second laser beam 170 has a lateral width 180 smaller than lateral width 148 of the first laser beam 168. For instance, the width 148 and the width 180 may each be in a range between 45 μm and 100 μm.

Advantageously, the first laser drilling (described referring to FIG. 2) is carried out with a wider first laser beam 168 than the second laser drilling (described referring to FIG. 3) which is carried out with a narrower second laser beam 170. A difference between the widths 148, 180 of the first laser beam 168 carrying out the first laser drilling and the second laser beam 170 carrying out the second laser drilling may be preferably in a range between 10 μm and 30 μm. Correspondingly, a difference between the widths 150, 148 of the first window 138 in the first electrically conductive layer structure 130 and the second window 140 in the second electrically conductive layer structure 130 may be preferably in a range between 10 μm and 30 μm. Advantageously, the width 180 of the second laser beam 170 may be smaller than the width 148 of the first laser beam 168. Correspondingly, the width 150 of the first window 138 may be larger than the width 148 of the second window 140.

As a result of the described manufacturing procedure, a certain overhang 152 may be produced also at an interface between the second electrically conductive layer structure 130 on the one hand and the lower electrically insulating layer structure 108 on the other hand in the region of the second window 140. The overhang 152 of the first electrically conductive layer structure 130 and the second electrically conductive layer structure 130 beyond the sidewalls 154 of the electrically insulating layer structures 108 delimiting the laser through hole 110 may be preferably not more than 10 μm.

Furthermore, a lateral offset may be generated as a lateral distance between the center of the first window 138 and the center of the second window 140. Such a lateral offset may be also present between a center of a first tapering section 126 in the electrically insulating layer structures 108 and resulting from the first laser drilling and a center of a second tapering section 128 in the electrically insulating layer structures 108 and resulting from the second laser drilling.

It has turned out that when the second window 140 is formed with a smaller width 150 than the width 148 of the first window 138, even a certain offset will not result in an excessive overhang 152, in particular at the first electrically conductive layer structure 130. As a result, a high electric reliability (which may be negatively influenced by an excessive overhang 152) of the readily manufactured component carrier 100 can be obtained after filling the laser through hole 110 with electrically conductive filling medium 112 (see FIG. 5), when back side laser drilling is carried out with a second laser beam 170 having a smaller width 180 then the width 148 of laser beam 168 used for front side drilling.

Surprisingly, in an attempt to keep the overhang 152 small, it has turned out to be very helpful when the first laser drilling is carried out with a lower laser power than the second laser drilling.

After having completed the first laser drilling with one laser shot from the front side (see FIG. 2) and the second laser drilling with only one further laser shot from the back side (see FIG. 3), a substantially X-shaped laser through hole 110 as shown in FIG. 3 may be subsequently filled partially or entirely with electrically conductive filling medium 112 (see FIG. 5). The electrically conductive filling medium 112 may be formed by electroless deposition combined with galvanically plating using the structure shown in FIG. 3 is a starting point. The embodiment of FIG. 3 is particularly advantageous when a simple manufacturing method is desired, since only two laser shots are sufficient to form the substantially X-shaped laser through hole 110.

Alternatively, a second laser shot from the bottom side may be carried out resulting in a shape of the laser through hole 110 shown in FIG. 4. Such a structure may be used in an alternative embodiment as a basis for filling the laser through hole 110 with electrically conductive filling medium 112. Formation of a laser through hole 110 with such a geometry will be described below referring to FIG. 4 in further detail.

Referring to FIG. 4, an additional third laser shot (or a second laser shot from the back side 106) may be executed from the bottom side to further open the middle diameter of the laser through hole 110. Descriptively speaking, the narrowest section of the laser through hole 110 of FIG. 3 may be widened with the third laser shot as shown in FIG. 4. This may contribute to a further improvement of the electric reliability, since it simplifies filling of the laser through hole 110 with electrically conductive filling medium 112. Thus, in the embodiment of FIG. 4, the first laser drilling from the front side 104 (see FIG. 2) comprises or consists of only one laser shot, and the second laser drilling from the back side 106 (see FIG. 3 and FIG. 4) comprises or consists of two laser shots. As a result of the additional third laser shot illustrated in FIG. 4, the obtained laser through hole 110 has a central substantially cylindrical section 124 between the two opposing tapering sections 126, 128.

Thus, the embodiment of FIG. 4 differs from the embodiment of FIG. 3 in that an additional third laser shot is carried out from the back side 106. This third laser shot has the effect that the general X-shape shown in FIG. 3 is extended into the shape shown in FIG. 4 with substantially cylindrical central section 124 of the laser through hole 110 connected to two opposing tapering sections 126, 128 on the front side 104 and on the back side 106, respectively.

FIG. 5 illustrates a cross-section of the component carrier 100 obtained based on the preform shown in FIG. 4 after filling the laser through hole 110 with electrically conductive filling medium 112. Although the procedure of filling the laser through hole 110 with electrically conductive filling medium 112 will be described below referring to the geometry of the laser through hole 110 shown in FIG. 4, it is alternatively possible to use the X-shaped laser through hole 110 according to FIG. 3 as a basis for this filling procedure in a corresponding way. Hence, it will be described next how the electrically conductive filling medium 112, preferably copper, is formed in the laser through hole 110 shown in FIG. 4.

In order to accomplish this, it is preferable to firstly carry out an electroless deposition procedure to thereby form a thin seed layer 144 of copper directly covering the sidewalls 154 of the electrically insulating layer structures 108 delimiting the laser through hole 110. This can be seen in a detail 121 in FIG. 5. A thickness of the seed layer 144 may be for instance 0.5 μm. However, it is also possible that the seed layer 144 has a thickness above 1 μm and/or that several cumulative seed layers are provided. For example, a thickness of a seed layer or a cumulative thickness of a plurality of seed layers may be in a range between 0.5 μm and 5 μm. When multiple seed layers are provided, they may comprise an organic (for instance polymer) layer, a palladium layer, and/or a copper layer. Formation of the seed layer 144 may promote a subsequent electroplating procedure, as described below.

Subsequently, further electrically conductive material (such as copper) may be deposited on the seed layer 144 by a plating procedure, in particular by electroplating or galvanically plating. Thus, the seed layer 144 on the sidewalls 154 as well as the electrically conductive layer structures 130 may be covered by a plating layer 146 of electrically conductive filling medium 112 such as copper. For instance, the plating layer 146 may have a minimum thickness of 10 μm.

During the described plating procedure of forming plating layer 146, an electrically conductive bridge structure 181 may be integrally formed with the plating layer 146 as a substantially horizontal portion connecting the opposing sidewalls 154 of the electrically insulating layer structures 108 delimiting the laser through hole 110. As shown, the electrically conductive bridge structure 181 is formed to be delimited by a concave upper first demarcation surface 182 oriented upwardly or facing towards the front side 104 and by a concave lower second demarcation surface 184 orientated downwardly or facing towards the back side 106. Forming the electrically conductive bridge structure 181 may be carried out by galvanic plating together with plating layer 146, preferably following the formation of the seed layer 144. The bridge structure 181 forms a substantially horizontal bridge between the opposing sidewalls 154 of the electrically insulating layer structures 108 delimiting the laser through hole 110 in the narrowest portion of the laser through hole 110.

Preferably, a narrowest vertical thickness w of the bridge structure 181 is at least 20 μm. In particular when the thickness D of the electrically insulating layer structures 108 is relatively small (in particular below 100 μm), a minimum vertical thickness w of the bridge structure 181 of 20 μm ensures proper reliability of the obtained component carrier 100.

Moreover, a first electrically conductive bulk structure 186 filling a major part between the first demarcation surface 182 and the front side 104 and a second electrically conductive bulk structure 188 filling a major part between the second demarcation surface 184 and the back side 106 are formed. This can be done by carrying out one or more further galvanic plating procedures following the previous plating procedure of forming the bridge structure 181.

Thus, the component carrier 100 according to FIG. 5 can be obtained by carrying out one or more further plating procedures. Thereby, the bulk structures 186, 188, which may for instance consist of copper, can be obtained. In the shown embodiment, a small dip 190, 192, respectively, remains at an upper side or a lower side of the shown component carrier 100. In other embodiments, the bulk structures 186, 188 fill the remaining recesses above the first demarcation surface 182 and below the second demarcation surface 184 almost completely. It should be said that it is well-known by a skilled person that the demarcation surfaces 182, 184 are clearly visible when imaging a cross-section of the component carrier 100.

The component carrier 100 obtained as a result of the described manufacturing procedure and illustrated in FIG. 5 thus comprises the electrically insulating layer structures 108 between the front side 104 and the back side 106, the patterned first electrically conductive layer structure 130 covering the upper electrically insulating layer structure 108 on the front side 104, the patterned second electrically conductive layer structure 130 covering the lower electrically insulating layer structure 108 on the back side 106, and the laser through hole 110 extending from the first window 138 of the first electrically conductive layer structure 130, through the electrically insulating layer structures 108 and up to the second window 140 of the second electrically conductive layer structure 130. The laser through hole 110 is filled with the electrically conductive filling medium 112.

Although the process according to FIG. 2 to FIG. 5 has been described on the basis of two electrically insulating layer structures 108 through which laser through hole 110 and electrically conductive filling medium 112 extend, a skilled person will understand that it is also possible to carry out such a process with any other number of three or more electrically insulating layer structures 108 of the same or different materials and/or of the same and/or different thicknesses. The free selection of material and thickness of the various electrically insulating layer structures 108 may allow to properly adjust the functionality of the component carrier 100.

Figure 6:
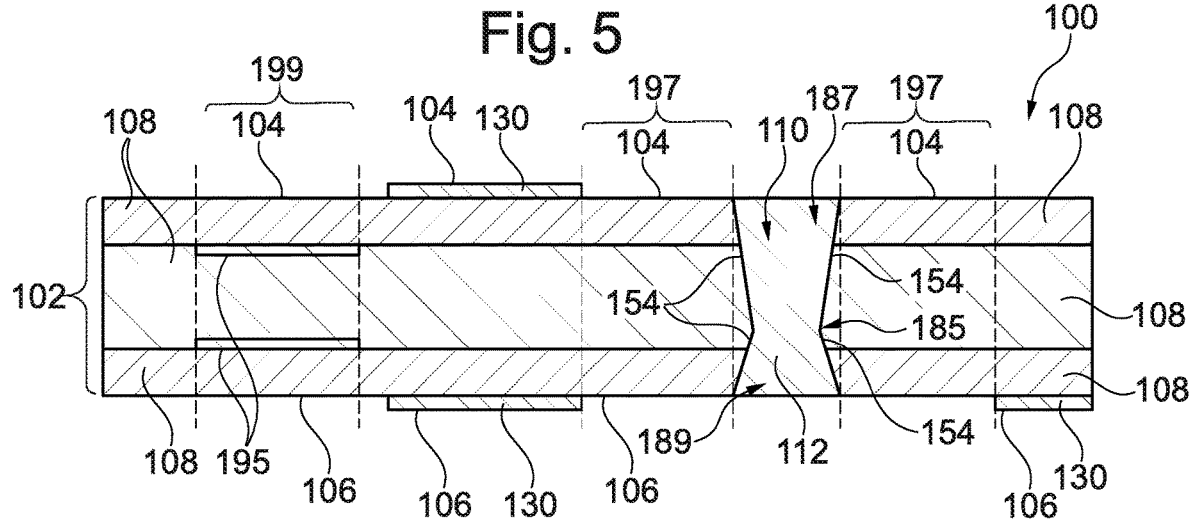
FIG. 6 illustrates a cross-sectional view of a component carrier according to still another exemplary embodiment of the invention.

FIG. 6 illustrates a cross-sectional view of a component carrier 100 according to still another exemplary embodiment of the invention.

The embodiment of FIG. 6 differs from the embodiment of FIG. 1 in particular in that, according to FIG. 6, the stack 102 consists of the electrically insulating layer structures 108 only in first region 197. First region 197 extends vertically from the front side 104 up to the back side 106 and laterally around the laser through hole 110 and its electrically conductive filling medium 112. Thus, the entire through hole 110 may be formed in an entirely dielectric portion of the stack 102 which is composed, in first region 197, exclusively by said electrically insulating layer structures 108 through which the through hole 110 extends. Moreover, the electrically insulating layer structures 108 are separated by electrically conductive layer structures 195 (here embodied as patterned copper foils) in a second region 199 which differs from the first region 197. Hence, the second region 199 is provided with the electrically conductive layer structures 195 to contribute to the electric connection function of the component carrier 100, etc.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a stack having a front side and a back side and comprising a plurality of stacked electrically insulating layer structures;
a through hole being narrower in its inner portion compared to its exterior portions and extending through the plurality of electrically insulating layer structures so that sidewalls of each of the electrically insulating layer structures delimit respective parts of the through hole; and
an electrically conductive filling medium filling at least a part of the through hole;
wherein an overall thickness of the electrically insulating layer structures of the stack is in a range between 70 μm and 200 μm;
wherein the stack consists of the electrically insulating layer structures at least in a first region which extends from the front side up to the back side around the through hole;
wherein the electrically insulating layer structures are separated by at least one electrically conductive layer structure in a second region.

2. The component carrier according to claim 1, wherein the stack comprises a core, in particular comprising with a substantially fully cured dielectric material.

3. The component carrier according to claim 2, wherein the core is free of copper foils.

4. The component carrier according to claim 1, wherein the electrically insulating layer structures comprise one or more of the following:
resin and reinforcing particles, in particular prepreg;
epoxy derivatives;
glass;
ceramic;
dry film material;
photo-liquid based material; and
functionalized dielectric material.

5. The component carrier according to claim 1, wherein the stack comprises an adhesion promoting layer.

6. The component carrier according to claim 1, wherein the stack comprises a core comprising FR4 covered on both opposing main surfaces thereof with a layer of epoxy derivatives.

7. The component carrier according to claim 1, wherein each individual one of the stacked electrically insulating layer structures has a thickness of at least 10 μm.

8. The component carrier according to claim 1, comprising at least one of the following features:
a component embedded in the stack, in particular in at least one of the stacked electrically insulating layer structures;
wherein a material of at least one of the electrically insulating layer structures is functionalized, wherein in particular the material of the at least one of the electrically insulating layer structures is functionalized as at least one of the group consisting of a mechanical buffer, a heat removal structure, and a low loss high-frequency dielectric;
wherein interfaces between mutually connected electrically insulating layer structures of the stack are free of electrically conductive material;
wherein the through hole is substantially X-shaped;
wherein the through hole has an inner substantially cylindrical section between two opposing tapering sections;
wherein the electrically conductive filling medium comprises a bridge structure which forms a substantially horizontal bridge between opposing sidewalls of the electrically insulating layer structures delimiting the through hole in the narrower, in particular narrowest, inner portion of the through hole;
configured as an interposer.

9. The component carrier according to claim 1, comprising at least one of the following features:
the through hole is a laser through hole;
the component carrier comprises at least one component which is surface mounted on and/or embedded in the stack, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one electrically conductive layer structure of the stack comprises at least one of the group consisting of copper, aluminum, nickel, silver, gold, palladium, and tungsten, any of the mentioned materials being optionally coated with supra-conductive material such as graphene;

wherein at least one of the electrically insulating layer structures comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component carrier is shaped as a plate;

wherein the component carrier is configured as one of the group consisting of a printed circuit board, and a substrate;

wherein the component carrier is configured as a laminate-type component carrier.

10. A method of manufacturing a component carrier, comprising:

providing a stack having a front side and a back side and comprising a plurality of stacked electrically insulating layer structures;

carrying out a first laser drilling into the electrically insulating layer structures from the front side to thereby form a blind hole in the stacked electrically insulating layer structures;

thereafter carrying out a second laser drilling into the electrically insulating layer structures from the back side to thereby extend the blind hole into a laser through hole being narrower in its inner portion compared to its exterior portions and extending through the plurality of electrically insulating layer structures so that sidewalls of each of the electrically insulating layer structures delimit respective parts of the laser through hole; and at least partially filling the laser through hole with an electrically conductive filling medium;

covering the electrically insulating layer structures with a first electrically conductive layer structure at the front side; and forming a first window extending through the first electrically conductive layer structure, in particular by laser drilling or by a conformal mask;

wherein carrying out the first laser drilling is completed by one laser shot; and wherein carrying out the second laser drilling is completed by two laser shots.

11. The method according to claim 10, wherein the method comprises:

carrying out the first laser drilling to extend through an entire first electrically insulating layer structure and into a part of a second electrically insulating layer structure;

carrying out the second laser drilling to extend through an entire third electrically insulating layer structure and into another part of the second electrically insulating layer structure so as to complete the through hole.

12. The method according to claim 10, wherein the method comprises:

covering the electrically insulating layer structures with a second electrically conductive layer structure at the back side; and forming a second window extending through the second electrically conductive layer structure, in particular by laser drilling or by a conformal mask.

13. The method according to claim 10, wherein the method comprises:

carrying out the first laser drilling to extend through at least part of at least two of the electrically insulating layer structures so as to form the blind hole in the stack;

carrying out the second laser drilling to extend through at least part of at least two of the electrically insulating layer structures so as to complete the through hole by connecting to the blind hole.

14. The method according to claim 10, wherein the method comprises: providing the stack with at least two of the plurality of stacked electrically insulating layer structures being at least partially directly connected with each other.

* * * * *